US010075151B2

(12) United States Patent
Siles Perez et al.

(10) Patent No.: US 10,075,151 B2
(45) Date of Patent: *Sep. 11, 2018

(54) HIGH POWER W-BAND/F-BAND SCHOTTKY DIODE BASED FREQUENCY MULTIPLIERS

(71) Applicant: California Institute of Technology, Pasadena, CA (US)

(72) Inventors: Jose Vicente Siles Perez, Pasadena, CA (US); Choonsup Lee, La Palma, CA (US); Goutam Chattopadhyay, Pasadena, CA (US); Ken B. Cooper, Glendale, CA (US); Imran Mehdi, South Pasadena, CA (US); Robert H. Lin, Chino, CA (US); Alejandro Peralta, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 6 days.

This patent is subject to a terminal disclaimer.

(21) Appl. No.: 14/952,361

(22) Filed: Nov. 25, 2015

(65) Prior Publication Data

US 2016/0149562 A1    May 26, 2016

Related U.S. Application Data

(60) Provisional application No. 62/084,753, filed on Nov. 26, 2014.

(51) Int. Cl.
*H03K 5/00* (2006.01)
*H01L 27/08* (2006.01)
(Continued)

(52) U.S. Cl.
CPC ..... *H03K 5/00006* (2013.01); *H01L 21/8252* (2013.01); *H01L 23/66* (2013.01);
(Continued)

(58) Field of Classification Search
CPC . H03K 5/00006; H01L 21/8252; H01L 23/66; H01L 27/0814; H01L 2223/6627; H01L 2924/0002; H04B 1/16
(Continued)

(56) References Cited

U.S. PATENT DOCUMENTS 9,143,084 B2 * 9/2015 Siles Perez ............ H03B 19/16
2013/0229210 A1   9/2013 Siles et al.

OTHER PUBLICATIONS

Siles et al., "Single-Waveguide Power-Combined Multipliers for Next Generation LO Sources Above 100 GHz", Proceedings of the 5th European Microwave Integrated Circuits Conference, Sep. 27-28, 2010, Paris, France, pp. 234-237.*
(Continued)

*Primary Examiner* — Benny Lee
*Assistant Examiner* — Hafizur Rahman
(74) *Attorney, Agent, or Firm* — Gates & Cooper LLP

(57) ABSTRACT

A solid state device chip including diodes (generating a higher frequency output through frequency multiplication of the input frequency) and a novel on-chip power combining design. Together with the on-chip power combining, the chip has increased efficiency because the diodes' anodes, being micro-fabricated simultaneously on the same patch of a GaAs wafer under identical conditions, are very well balanced. The diodes' GaAs heterostructure and the overall chip geometry are designed to be optimized for high power operation. As a result of all these features, the device can generate record-setting power having a signal frequency in the F-band and W-band (30% conversion efficiency).

18 Claims, 9 Drawing Sheets

(51) Int. Cl.
    H01L 23/66      (2006.01)
    H01L 21/8252    (2006.01)
    H04B 1/16       (2006.01)
(52) U.S. Cl.
    CPC ........... *H01L 27/0814* (2013.01); *H04B 1/16*
           (2013.01); *H01L 2223/6627* (2013.01); *H01L*
                                  *2924/0002* (2013.01)
(58) Field of Classification Search
    USPC .......................................................... 333/218
    See application file for complete search history.

(56)         References Cited

OTHER PUBLICATIONS

Maestrini et al., "Schottky diode-based terahertz frequency multipliers and mixers", Terahertz electronic and optoelectronic components and systems, 2010 Academie des sciences. Published by Elsevier Masson SAS, pp. 480-495.*
Lee et al., "High-Efficiency W-Band GaAs Monolithic Frequency Multipliers", IEEE Transactions on Microwave Theory and Techniques, vol. 52, No. 2, Feb. 2004, pp. 529-535.*
Hrobak et al. "Planar Varistor Mode Schottky Diode Frequency Tripler Covering 60 GHz to 110 GHz",2013 IEEE MTT-S International Microwave Symposium Digest (MTT), pp. 1-4.*
Song, H-J., et al., "Present and Future of Terahertz Communications", IEEE Transactions on Terahertz Science and Technology, Sep. 2011, pp. 256-263, vol. 1., No. 1.
Cooper, K.B., et al., "THz Imaging Radar for Standoff Personnel Screening", IEEE Transactions on Terahertz Science and Technology, Sep. 2011, pp. 169-182, vol. 1, No. 1.
Chattopadhyay, G., "Technology, Capabilities, and Performance of Low Power Terahertz Sources", IEEE Transactions on Terahertz Science and Technology, Sep. 2011, pp. 33-53, vol. 1., No. 1.
Ferber, R.R., et al., "W Band MMIC Power Amplifiers for the Herschel HIFI Instrument", Proc. of 14th International Symposium on Space THz Technology, Apr. 2003, pp. 73-82.
Siles, J.V., et al., "Design of a High-Power 1.6 THz Schottky Tripler Using 'On-chip' Power-Combining and Silicon Micromachining", In Proc. of 22nd International Symposium on Space THz Technology, Apr. 2011, pp. 1-4.
Thomas, B., et al., "W-band balanced frequency tripler using a novel coupled lines biasing scheme compatible with flip-chip mounting", In Proc. of 23rd International Symposium on Space THz Technology, Apr. 2012, pp. 1-3.
Vukusic, J., et al., "High Power W-band Monolithically Integrated Tripler", In Proc. of 34th International Conference on Infrared, Millimeter and THz Waves, Sep. 2009, pp. 1-2.
Maestrini, A., et al., "In-Phase Power-Combined Frequency Triplers at 300 GHz", IEEE Microwave and Wireless Components Letters, Mar. 2008, pp. 218-220, vol. 18, No. 3.
Maestrini, A., et al., "A 540-640-GHz High-Efficiency Four-Anode Frequency Tripler", IEEE Transactions on Microwave Theory and Techniques, Sep. 2005, pp. 2835-2843, vol. 53, No. 9.
Radisic, V., et al., "A 50 mW 220 GHz Power Amplifier Module", IEEE MTT-S Int. Microwave Symp. Dig., Jun. 2010, pp. 45-48.
Virginia Diodes, Inc., "High-Efficiency 94 GHz Frequency Tripler Development at VDI," Company newsletters, Feb. 2008, http://vadiodes.com/VDI/pdf.
Siles, J.V., et al., "A High-Power 105-120 GHz Broadband On-Chip Power-Combined Frequency Tripler", IEEE Microwave and Wireless Components Letters, Mar. 2015, pp. 157-159, vol. 25, No. 3.

* cited by examiner

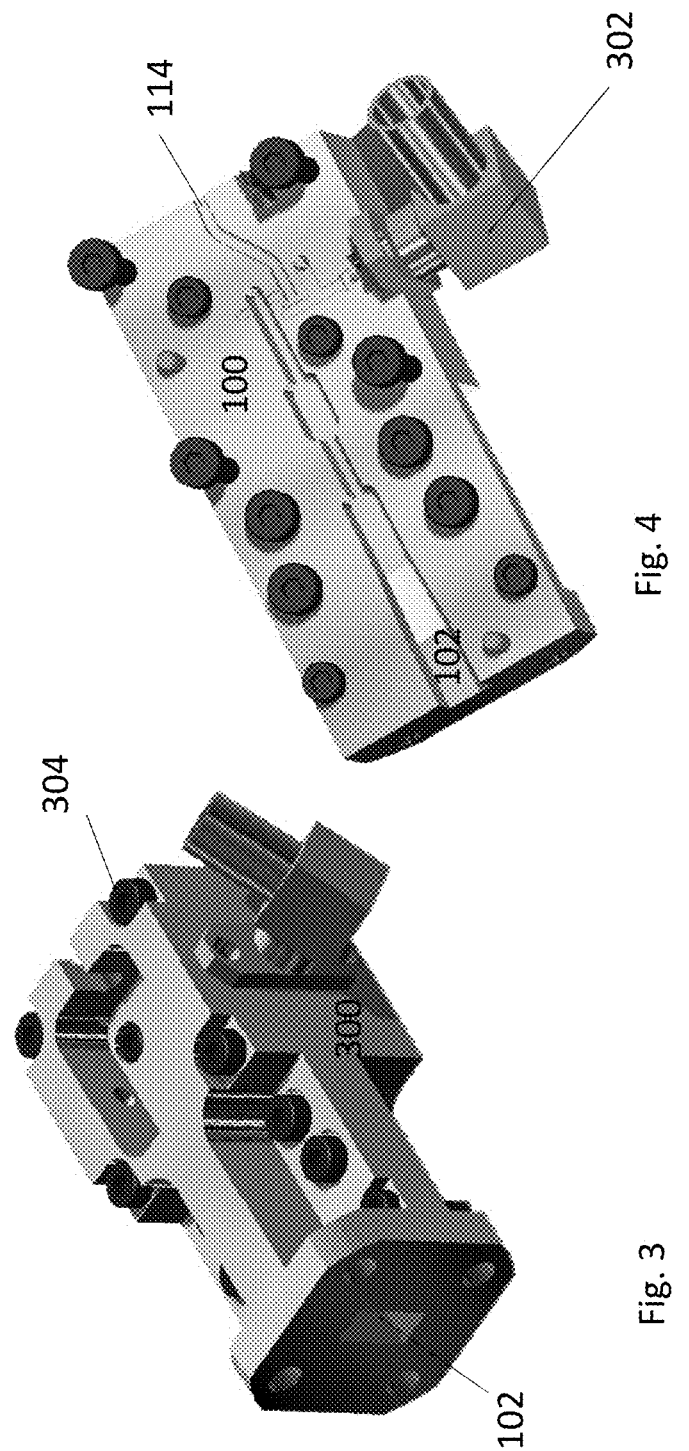

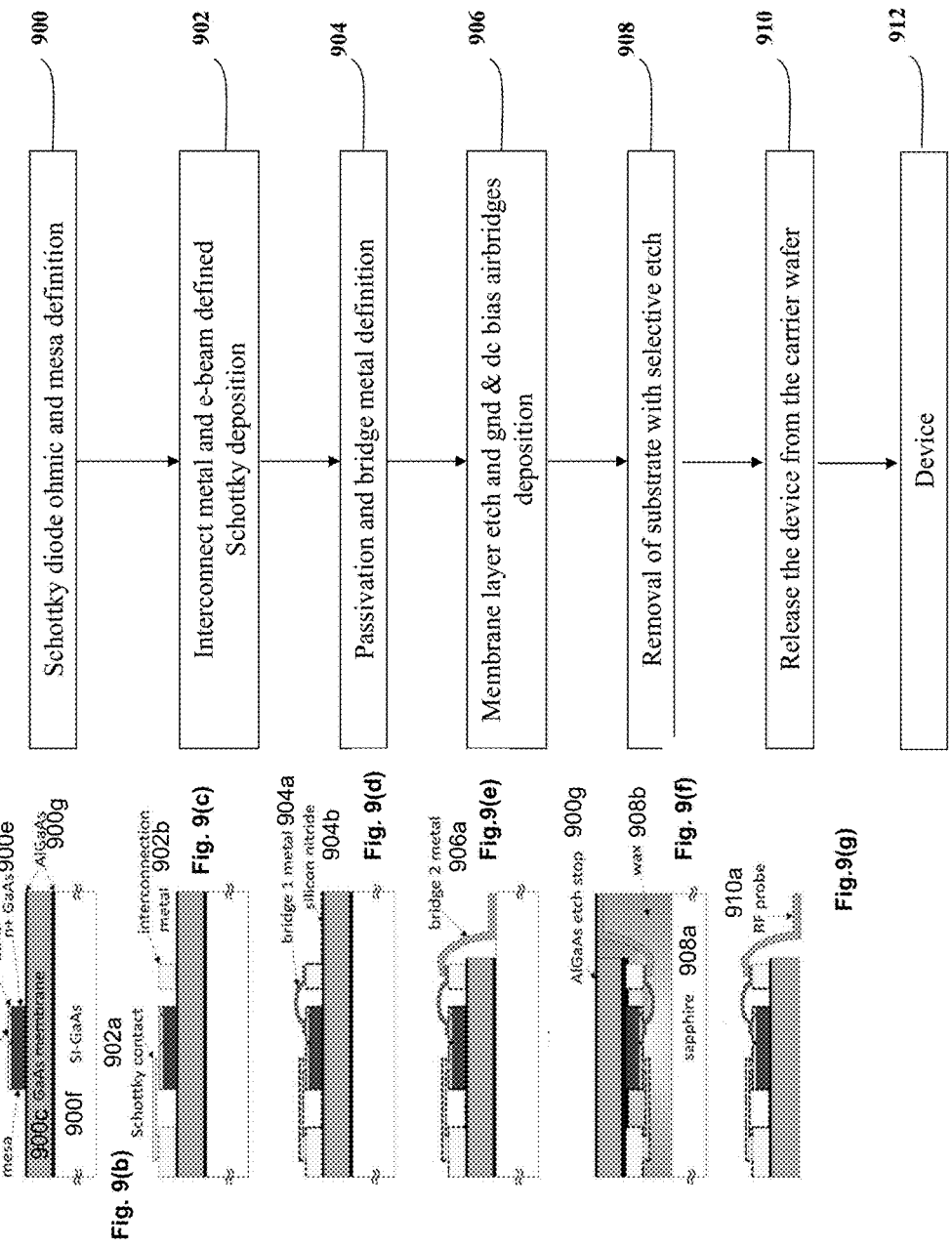

Fig. 9(a)

- 900: Schottky diode ohmic and mesa definition
- 902: Interconnect metal and e-beam defined Schottky deposition
- 904: Passivation and bridge metal definition
- 906: Membrane layer etch and gnd & dc bias airbridges deposition
- 908: Removal of substrate with selective etch
- 910: Release the device from the carrier wafer
- 912: Device Fig. 9(b) — 900a mesa, 900b ohmic, 900c GaAs membrane, 900d n-GaAs, 900e n+ GaAs, 900f SI-GaAs, 900g AlGaAs Fig. 9(c) — 902a Schottky contact, 902b interconnection metal Fig. 9(d) — 904a bridge 1 metal, 904b silicon nitride Fig. 9(e) — 906a bridge 2 metal Fig. 9(f) — 900g AlGaAs etch stop, 908a sapphire, 908b wax Fig. 9(g) — 910a RF probe

HIGH POWER W-BAND/F-BAND SCHOTTKY DIODE BASED FREQUENCY MULTIPLIERS

CROSS REFERENCE TO RELATED APPLICATIONS

This application claims the benefit under 35 U.S.C. Section 119(e) of commonly-assigned U.S. Provisional Patent Application Ser. No. 62/084,753, filed on Nov. 26, 2014, by Jose Vicente Siles Perez, Choonsup Lee, Goutam Chattopadhyay, Ken B. Cooper, Imran Mehdi, Robert H. Lin, and Alejandro Peralta, entitled "ULTRA-HIGH POWER W-BAND/F-BAND SCHOTTKY DIODE BASED FREQUENCY MULTIPLIERS;"

which application is incorporated by reference herein.

This application is related to U.S. Utility patent application Ser. No. 13/595,964, filed on Aug. 27, 2012, now U.S. Pat. No. 9,143,084, issued Sep. 22, 2015, by Jose Vicente Siles Perez, Goutam Chattopadhyay, Choonsup Lee, Erich T. Schlecht, Cecile D. Jung-Kubiak, and Imran Mehdi, entitled "ON-CHIP POWER-COMBINING FOR HIGH-POWER SCHOTTKY DIODE BASED FREQUENCY MULTIPLIERS," which application claims the benefit under 35 U.S.C. Section 119(e) of U.S. Provisional Patent Application, No. 61/527,506, filed on Aug. 25, 2011, by Goutam Chattopadhyay, Imran Mehdi, Erich T. Schlecht, Choonsup Lee, Jose V. Siles, Alain E. Maestrini, Bertrand C. Thomas, Cecile D. Jung, entitled "ON-CHIP POWER-COMBINING FOR HIGH-POWER SCHOTTKY DIODE BASED FREQUENCY MULTIPLIERS;"

all of which applications are incorporated by reference herein.

STATEMENT REGARDING FEDERALLY SPONSORED RESEARCH AND DEVELOPMENT

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

This invention relates to on-chip power combining for high-power Schottky diode based frequency multipliers.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

High-power sources in the W-band (70-110 GHz) and the F-band (90-140) Gigahertz (GHz) range are in demand for a variety of applications. Most prominently, the sources can be used for terahertz communications [1] and in millimeter- and submillimeter-wave radars or radiometers, which are being considered for security applications such as surveillance, mass transit security, and perimeter intrusion detection. Reaching the highest possible powers is critical for radars that operate at long range, or that require distributing signal power to multiple transmitters and receivers [2]. These systems often benefit by operating within atmospheric absorption windows, which are located around 230, 345, 460, and 690 GHz. Frequency-multiplied Schottky diode sources are a preferred technology to generate relatively high power in the submillimeter-wave ranges; see sources review in [3]. But with efficiencies in the 10% range for submillimeter-wave multipliers, very high-power sources (>100 milliwatts (mW)) around 115 GHz are needed to reach those windows (using multiplication factors of ×2, ×3, ×2×2, and ×2×3 respectively). Multi-pixel terahertz receivers for astrophysics can also benefit from high-power W-band and F-band sources, which require local oscillator power to be distributed among many mixers.

Solid state amplifiers would be a preferable alternative to Schottky diodes for generating power at high frequencies. However, there are currently no commercially available amplifiers that extend beyond 110 GHz (several do reach the 100-110 GHz band, for example HRL [4] and Millitech [5]). Years ago, TRW fabricated amplifiers that work up to 120 GHz for the Herschel Space Observatory [6], but these are no longer available or offered for sale. Amplifier technology is progressing fast and power levels of 50 mW have been demonstrated at 220 GHz using InP transistors [7], but only by power-combining eight amplifiers, which has a clear impact on complexity and cost.

SUMMARY OF THE INVENTION

One or more embodiments of the invention disclose a solid-state device, comprising a chip including diodes (generating a higher frequency output through frequency-multiplication of the input frequency) and a novel on-chip power combining technique. Together with the on-chip power combining concept that increases up to a factor of four its power handling capabilities, the device has increased efficiency because the diodes' anodes, being micro-fabricated simultaneously on the same patch of a GaAs wafer under identical conditions, are very well balanced in terms or electrical behavior. The diodes' GaAs heterostructure and the overall chip geometry are designed to be optimized for ultra high power operation (around 80 mW input power per diode). As a result of all these features, the solid state device can generate record-setting power at a signal frequency in the F-band and W-band (30% conversion efficiency).

The chip has two independent outputs that can be either used separately to transit power to two different systems, or combined together using a waveguide power combiner to maximize the output power of the device.

In one or more embodiments, the device includes a multiplier device, comprising a waveguide block comprising an input waveguide and output waveguides, wherein the input waveguide guides an input signal/wave received from a source; and a chip connected to the input waveguide, the chip comprising a novel implementation of two or more multiplying structures. Each of the multiplying structures include an input E-probe structured for receiving the input signal from the input waveguide, two or more Schottky diodes, and one or more stripline based input matching networks structured to transmit the input signal from the input E-probe to the two or more Schottky diodes, to generate an output signal two or three times the frequency of the input signal using the non-linear properties of the Schottky diodes.

Each of the multiplier structures can further comprise one or more stripline based output matching networks structured for transmitting the output from each of the Schottky diodes to an output E-probe (that is included in the chip). The output E-probe transmits the multiplier output, comprising the sum of the output power generated in each of the Schottky diodes, off the single chip and into one the output waveguide.

Each of the multiplier structures can include metal direct current (DC) bias lines for biasing the Schottky diodes to optimize the device performance. A total thickness of the chip, including the metal DC bias lines and the substrate for the chip, can be in a range of 3 micrometers 100 micrometers. The chip can include one or more pairs of the Schottky diodes in a balanced configuration per multiplying structure.

The output waveguides can combine the two independent multiplier outputs from each of the multiplier structures to produce a combined output. The waveguide block can consist essentially of any metal, gold plated or not, that ensures a good electrical conductivity at the frequency of operation (e.g., aluminum, copper or gold-plated brass)

The input source can include a frequency synthesizer followed by an amplifier outputting the frequency in a range of 23-47 (GHz) and/or an isolator. A coax to waveguide transition can be used for transmitting the input signal from the amplifier to the input waveguide.

The GaAs heterostructure and the chip's geometry can be optimized such that the chip can handle a total input power of around 1 Watt and outputs a power of at around 200 milliwatts. For example, the unique chip designs according to one or more embodiments of the invention can produce up to 200 mW of power at a frequency up to 120 GHz with efficiencies of around 30%.

Prior to the present disclosure, frequency multipliers at this frequency band exhibited ~5% conversion efficiencies and maximum input power levels of around 200 mW. Thus, one or more embodiments of the invention can provide a factor of 5 improvement in power handling capabilities for a single-chip Schottky diode based frequency multiplier.

The multiplier device can be used directly as a transmitter when connected to an external output antenna (e.g. horn antenna), as the local oscillator for an array of heterodyne receivers connected to the local oscillator, or as a driver stage for higher frequency sources.

BRIEF DESCRIPTION OF THE DRAWINGS

Referring now to the drawings in which like reference numbers represent corresponding parts throughout:

FIG. 3 and FIG. 4 illustrate block designs for a tripler, according to one or more embodiments of the invention.

FIGS. 9(a)-9(g) illustrate a flow chart and schematics describing a method of fabricating a Schottky diode based frequency multiplier device including an integrated circuit, according to one or more embodiments of the present invention.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

TECHNICAL DESCRIPTION

Design and Fabrication

Leveraging on the Jet Propulsion Laboratory's state-of-the-art Schottky diode process developed for the local oscillators in Herschel, the inventors have developed broadband high-performance (~30% peak efficiency and 17% bandwidth) frequency triplers able to handle up to 950 mW input power and produce up to 200 mW output power in the 105-120 GHz range with a single Monolithic Microwave Integrated Circuit (MMIC) device. The solution, according to one or more embodiments of the invention, incorporates a novel topology called 'on-chip power-combining' that increases by a factor of two (this work, see FIG. 1), or even 4 (see [8, 9]), the power-handling of traditional frequency multipliers, without the need of combining several discrete chips in waveguide power combiners [8, 9]. The epi-structure and anode size of the tripler devices have been thoroughly optimized to get maximum performance in terms of power-handling and efficiency at these frequency bands. Previous works showed 7% @ 102 GHz (input power ($P_{in}$)=200 mW) [10], 27% (7% bandwidth) at 94 GHz ($P_{in}$=240 mW) [11], and 20% (4% bandwidth) at 94 GHz ($P_{in}$=400 mW) [12]. The highest input power reported for a single chip Schottky multiplier was 460 milliwatts (mW), achieved by using a CVD diamond substrate to efficiently take away heat from the anodes [3].

Even when high-power amplifiers do become available above 110 GHz, one or more embodiments of the invention may still be very attractive for many applications because the tripler devices can be pumped with low-cost high-power Ka-band (or lower) amplifiers that are commercially available from many vendors worldwide.

Figure 1:
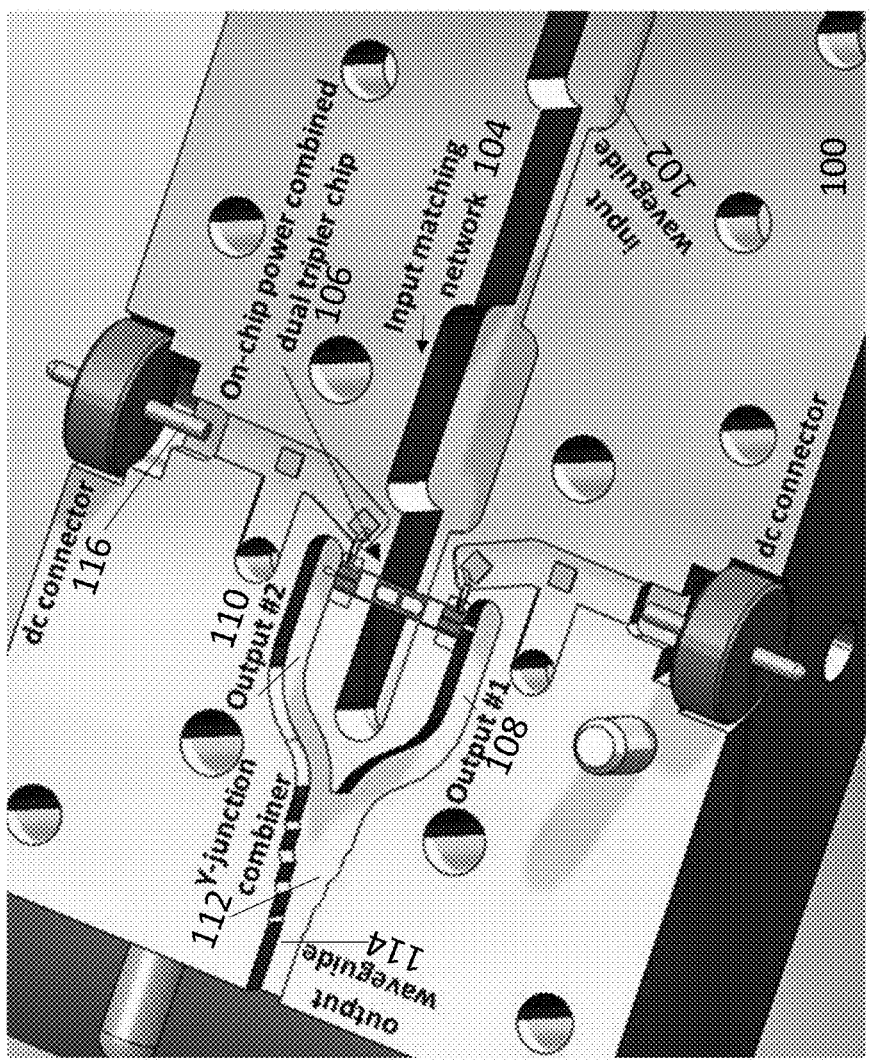
FIG. 1 is a three dimensional (3-D) schematic view of the bottom half of the on-chip power-combined 105-120 GHz frequency tripler, completely fabricated at the MicroDevices Laboratory at the Jet Propulsion Laboratory (JPL) according to one or more embodiments of the invention.

FIG. 1 illustrates a tripler including a block or housing 100, the block 100 or housing including an input waveguide 102. The input waveguide 102 includes an input matching network 104 having one or more waveguide matching sections of different length and height to optimally couple the input signal, comprising an exciting electric field in the Ka-band, into the input antennas or E-probes within the on-chip power combined dual tripler chip 106. The block 100 further comprises output waveguides 108, 110 (Output #1 and Output #2) whose output is combined in a Y-junction or hybrid coupler 112 feeding an output waveguide 114. The output waveguides 108, 110, 114 and Y-junction (or hybrid coupler) combiner are dimensioned to optimally couple in phase the multiplied output signal, comprising an electric field, out of the chip 106. Also shown are DC connectors 116.

Figure 2:
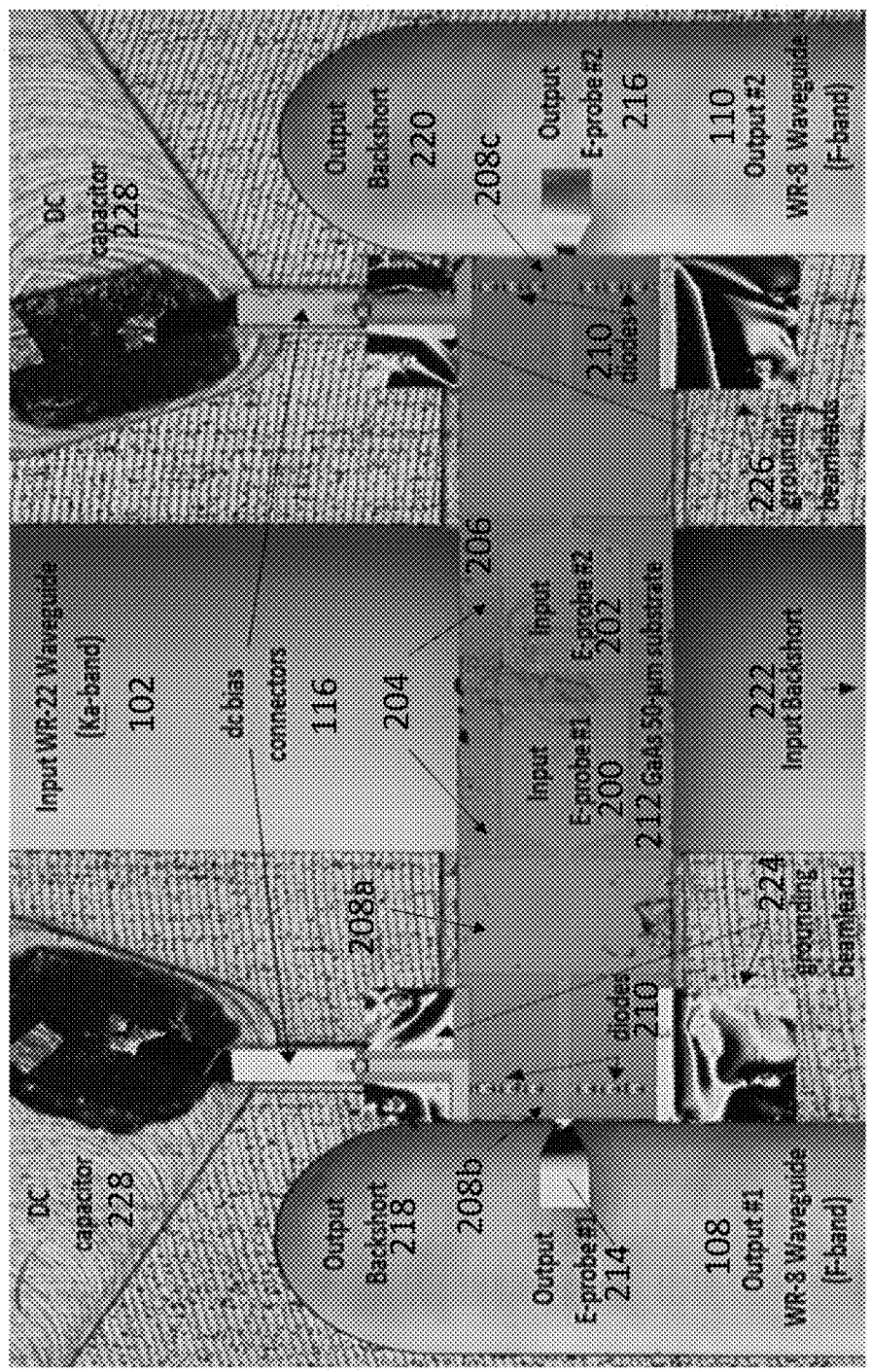
FIG. 2 is a close-up view of the on-chip power combined 105-120 GHz balanced frequency tripler, wherein the tripler features a total of 12-anodes (6 on each side), and wherein the chip was completely fabricated at the MicroDevices Laboratory at JPL according to one or more embodiments of the invention.

The novel on-chip power combining concept introduced in [8, 9] was used in the 105-110 GHz tripler presented here to increase power handling by a factor of two. As shown in FIG. 2, two input E-probes 200, 202 equally divide the input signal (TE 10 waveguide mode) from the input waveguide 102 (WR-22 waveguide, Ka-band) between two identical balanced multiplying structures 204 on a same chip 206. Each of those structures 204 features 6 anodes each having Cj0=104 fF, as well as stripline sections 208a, 208b, 208c of low and high impedance to match the diodes 210 (each comprising an anode) at the input (208a) and output (208b, 208c) frequencies and to prevent the third harmonic from leaking into the input waveguide 102. The anode size and DC reverse bias voltage were carefully optimized to maximize the efficiency of the device for a nominal input power of 400-500 mW. The design process is iterative and involves 3D electromagnetic simulation and nonlinear circuit simulations, and is similar to that explained in [14].

The chip 206 is supported by a 50 µm-thick GaAs substrate 212 to prevent overheating. The dimensions of the output waveguide 108-110 (WR-8 waveguide for F-band) ensure that the first and second harmonics are cut off, and the balanced configuration of the diodes 210 ensures that the power levels from all the even harmonics of the input signal are strongly suppressed. The design is completed with a series of waveguide sections 104 to provide broadband input matching to the diodes (see FIG. 1). Another advantage of the on-chip power combined topology is that the chip provides two independent outputs 108, 110 that can be operated separately (e.g. for multi-pixel sources) or combined together using a simple Y-junction 112 (see FIG. 1).

FIG. 2 further illustrates the output E-probes 214, 216 (output E-probe #1 and output E-probe #2) for coupling the multiplied signal outputted from the diode 210 into the output waveguides 108-110. Also illustrated in FIG. 2 are output backshorts 218, 220, input backshort 222, grounding beamleads 224, 226 and DC capacitors 228.

Compared to traditional power-combining techniques [13], the electrical balance and symmetry of this circuit relies more on the superior accuracy of the lithographic fabrication of the MMIC chip rather than on the accuracy of manually assembling multiple devices, especially at higher frequencies. This considerably reduces waveguide losses derived from using unnecessary waveguide power-combining structures, eliminates losses due to electrical asymmetries between chips when several discrete chips are power-combined, and simplifies significantly the component assembly [9].

FIGS. 3 and 4 illustrate a waveguide block 300 including input waveguide 102, output waveguide 114, connection 302 for providing DC bias to connection 116 and ground 226, and screws for 304 fastening the two halves (e.g., 100) of the block 300 together.

Test Setup According to One or More Embodiments

The source used to test the on-chip power combined triplers consisted of a 40 GHz synthesizer tuned in the 33.3-40 GHz range, followed by a Ka-Band Medium Power Amplifier, and a coaxial-to-waveguide (2.92 mm/WR-28) transition connecting the amplifier to the 105-120 GHz Schottky diode based frequency tripler. To well characterize these devices, the input power of the triplers, after the amplifier and transition, was first calibrated by varying the output power level of the synthesizer at each measured frequency point. A thermal power sensor was used for the calibration. The output power of the triplers was measured using a one-inch long WR-8 to WR-10 transition and an Ericksonmeter1. The results presented here are not corrected for the transition loss. Also shown is wiring for providing DC bias and ground to connectors 116 and 226, respectively.

For all measurements, the input power of the tripler was kept constant across the band in the 100-900 mW range, and the reverse dc bias voltage was adjusted at each frequency point (between −3 V to −5 V, reverse voltage, per anode) to obtain the maximum performance. The two bias lines were tied together for simplified operation since the balance of both sides of the chip was nearly perfect.

Figure 5:
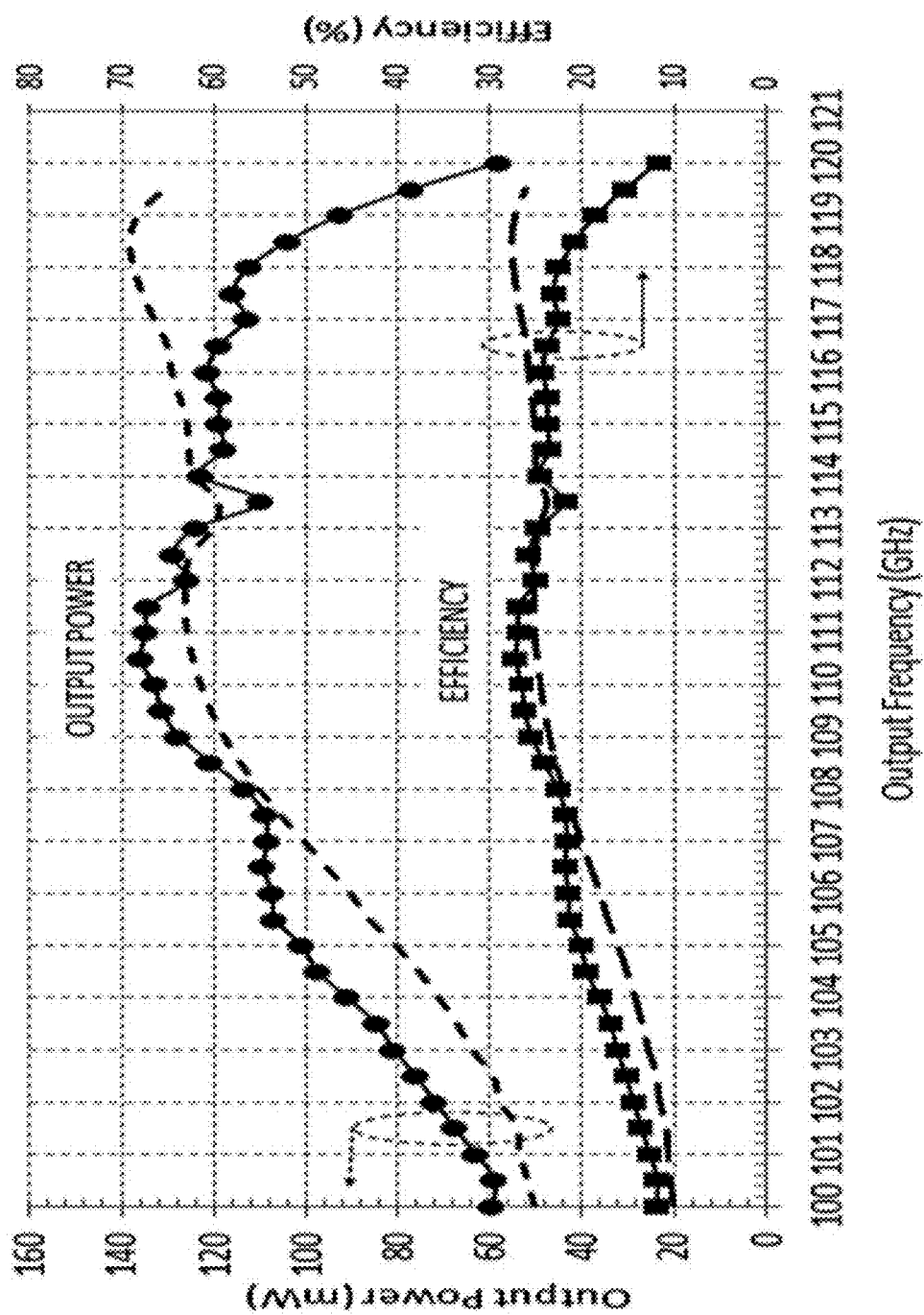
FIG. 5 illustrates measured (solid lines) and simulated (dashed lines) output power and efficiency as a function of output frequency of the on-chip power combined 105-120 GHz tripler described in FIG. 1 and FIG. 2, wherein input power is kept constant (500 mW) across the band and bias voltage is adjusted to each frequency point for maximum performance.

The first test consisted of measuring the bandwidth and performance of the tripler for the nominal input power level (~500 mW) and comparing the results with the simulations. For this test, a 10-dB directional coupler was inserted between the tripler and the amplifier in order to simultaneously monitor the actual input and output power of the tripler, and to obtain the real efficiency of the tripler. As shown in FIG. 5, there is very good agreement between measurements and simulations. The measured peak efficiency is around 28% at the center of the band with a 3-dB bandwidth of ~17%.

Figure 6:
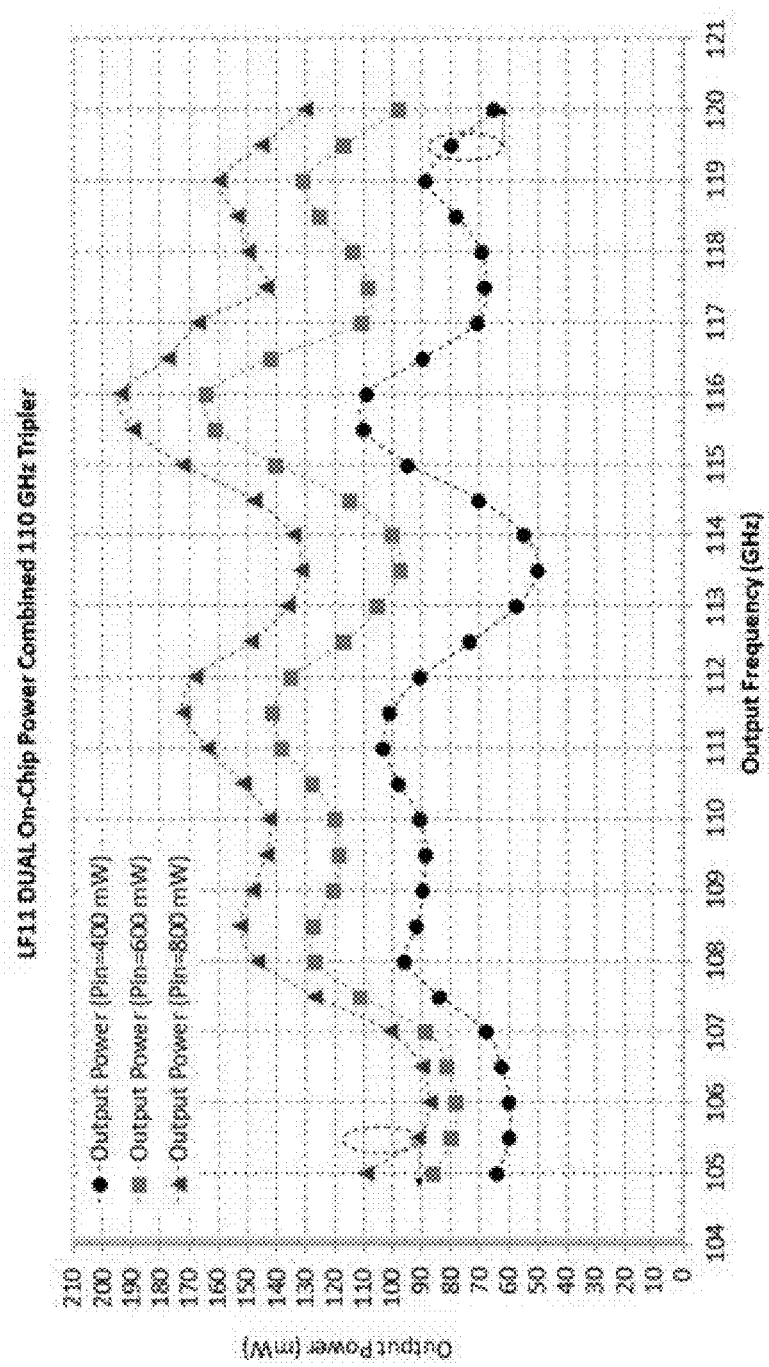
FIG. 6 illustrates measured output power as a function of the output frequency for different input power levels, for the tripler described in FIG. 1 and FIG. 2.

The frequency sweep was repeated for input power levels of 400, 600, and 800 mW, and the results are presented in FIG. 6. In this case, the input power was characterized independently and no directional coupler was used to try to maximize the available input power for the tests. This caused more standing-waves to appear in this measurement when compared to those measured in FIG. 5. Since the power is not measured in real-time in this case, it cannot be guaranteed that the input power is constant across the measured frequency band. It can be seen that the maximum output power delivered by the tripler is close to 200 mW for 800 mW input power levels. To date, this is the highest demonstrated output power (at a frequency beyond 100 GHz) from a single-chip Schottky diode based frequency tripler. The maximum input power measured for this tripler design before catastrophic failure was ~960 mW, which is also the highest input power reported so far for a Schottky based frequency multiplier beyond 100 GHz (using a single-chip configuration with GaAs substrates).

Comparison with a Traditional 105-120 GHz Tripler

Figure 7A:
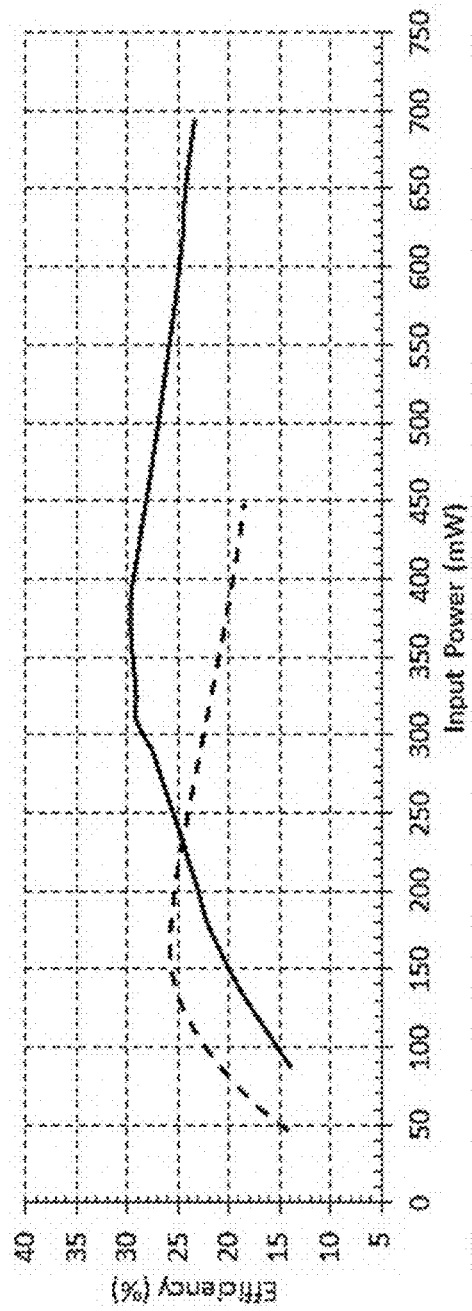
FIG. 7(a)-7(b) plots measured efficiency at 110 GHz vs. input power (FIG. 7(a)) and bandwidth (FIG. 7(b)) for the on-chip power-combined tripler (solid lines) described in FIG. 1 and FIG. 2, and for a traditional tripler with no power-combining (dashed lines).
Figure 7B:
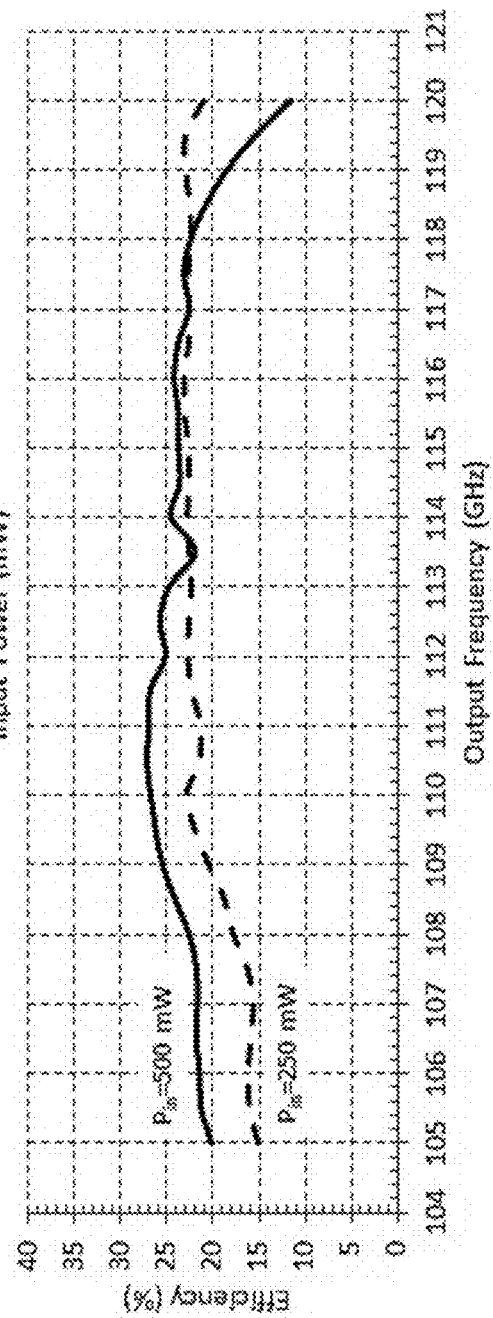
Figure 8:
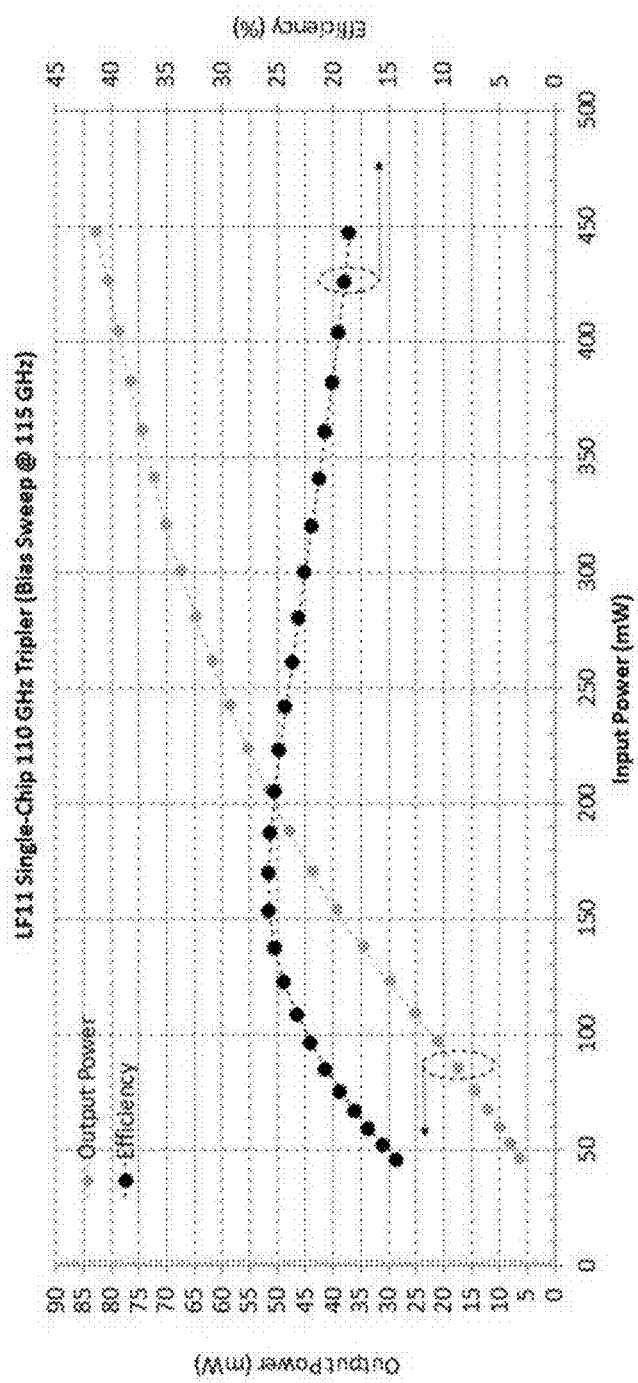
FIG. 8 plots output power and efficiency as a function of input power for a 110 GHz tripler (bias sweep at 115 GHz) described in FIG. 1 and FIG. 2.

In order to confirm the importance of the on-chip power-combined topology, a traditional 105-120 GHz frequency multiplier chip with no power combining was also fabricated and tested. This device chip is identical to exactly half of the chip shown in FIG. 2, and was made in the fabrication run. The comparison is shown in FIG. 7(a)-7(b).

As expected, the on-chip power-combined version (solid lines) handles twice the input power of the conventional version (dashed lines). The conventional device showed catastrophic failure at 460 mW and the on-chip power-combined version at around 1000 mW. The peak efficiency of the latter is even higher, which is likely due to fabrication variations from chip to chip. The inventors conclude that there is no penalty in efficiency for on-chip power-combining, and the improvement in output power and power handling can be assumed to be 3 dB. The frequency bandwidth, which is shown in FIG. 7(b), was measured as well and found to be nearly identical in both cases.

Thus, the present invention has demonstrated a very high-power broadband on-chip power-combined F-band frequency tripler. In one or more embodiments, the tripler produces approximately twice as much power as traditional designs without losing efficiency or bandwidth. To the best of the inventors' knowledge this is the highest-power, most efficient frequency tripler demonstrated beyond 100 GHz, and it represents an important step toward building more powerful sources in the millimeter- and submillimeter-wave ranges, for radar and multi-pixel terahertz receiver development.

Process Steps

Chip Fabrication

FIG. 9(a)-(g) illustrate a method of fabricating a multiplier structure, according to one or more embodiments of the invention (referring also to FIG. 1 and FIG. 2).

Block 900 and FIG. 9(b) represent lithographically patterning the Schottky diode mesa 900a and ohmic contact 900b formation on a Gallium Arsenide wafer 900c. The Schottky diode can comprise n-GaAs 900d and n+GaAs 900e formed on a Si—GaAs substrate 900f. Also shown are AlGaAs layer(s) 900g.

Block 902 and FIG. 9(c) represent the deposition of the Schottky anodes or Schottky contacts 902a using electron beam lithography (e-beam), and the deposition of the metal interconnection lines 902b that connect the Schottky diodes with the input and output matching network and form the stripline matching sections and input and output antennas (208a-c, 200, 214, 216). The input E-probe can comprise Ka-band stripline antennas, and the output E-probes can comprise W-band or F-band stripline antennas.

Block 904 and FIG. 9(d) illustrate the formation of the bridge metals 904a that electrically connect the diodes with the interconnection metal 902b that forms the rest of the multiplier circuit. FIG. 9(d) also illustrates the passivation process using silicon nitride 904b to protect the circuit metal lines.

Block 906 represents the membrane layer etch from the original wafer thickness down to the thickness required for the submillimeter-wave circuit, usually 2-50 µm. Metal airbridges 906a for the direct current (DC) bias line and the ground (gnd) connections are deposited at this point as well, as shown in FIG. 9(e). Blocks 908 and 910 represent the removal of the unnecessary parts of the GaAs substrate so that the complete chip can be released from the carrier wafer. During this step, the chip can be attached to a carrier wafer (e.g., sapphire 908a) using wax 908b and the substrate can be removed using an AlGaAs etch stop layer 900g, as shown in FIG. 9(f), and the chip/device can then be removed from the carrier wafer as shown in FIG. 9(g). FIG. 9(g) also illustrates formation of a radio frequency (RF) probe 910a.

Block 912 represents the end result, a chip 206 including diodes 210, an on-chip power combining system 208b, 208c, 214, 216, and an on-chip power distribution system 200, 202, 208a. The on-chip power distribution system 200, 202, 208a distributes an input power, transmitted onto the chip 306 and having an input frequency, among the diodes 210. The diodes 210 each comprise an anode and a GaAs heterostructure. The diodes 210 each generate a higher frequency output through frequency-multiplication of the input frequency, and each of the outputs are combined to form a combined output power using the on-chip power combining system 208b, 214, 216. Together with the on-chip power combining concept that increases up to a factor of four its power handling capabilities, the device has increased efficiency because the diodes' anodes, being micro-fabricated simultaneously on the same patch of a GaAs wafer under identical conditions, are very well balanced in terms of electrical behavior. The diodes 210 can be balanced such that branches (including output striplines 208b-c) of the multiplier (e.g., both branches 204 of a dual-chip multiplier) are balanced (i.e., the branches, including output striplines 208b and 208c have identical/substantially identical electrical characteristics). Branches having different (complex) impedances at the output radio frequencies (RF) frequencies cause reflections (i.e., mismatches) that reduce the efficiency of the power-combining. The balanced diodes 210 according to one or more embodiments of the present invention perfect constructive interference of the two output waves generated by the diodes 210 in order to generate the highest power at the output 114. For example, when the DC bias is applied to the anodes via bias lines 116, the chip can generate the combined output power with an efficiency of at least 20% or at least 30%, the efficiency defined as 100×(combined output power/input power). The GaAs heterostructure and the chip's geometry is optimized such that the combined output power is at least 20% for the required input power. The maximum power handling for this design is around 1 Watt.

The chip has can have two independent outputs that can be either used separately to transit power to two different systems, or combined together using a waveguide power combiner to maximize the output power of the device.

Multiplier Assembly

Figure 10:
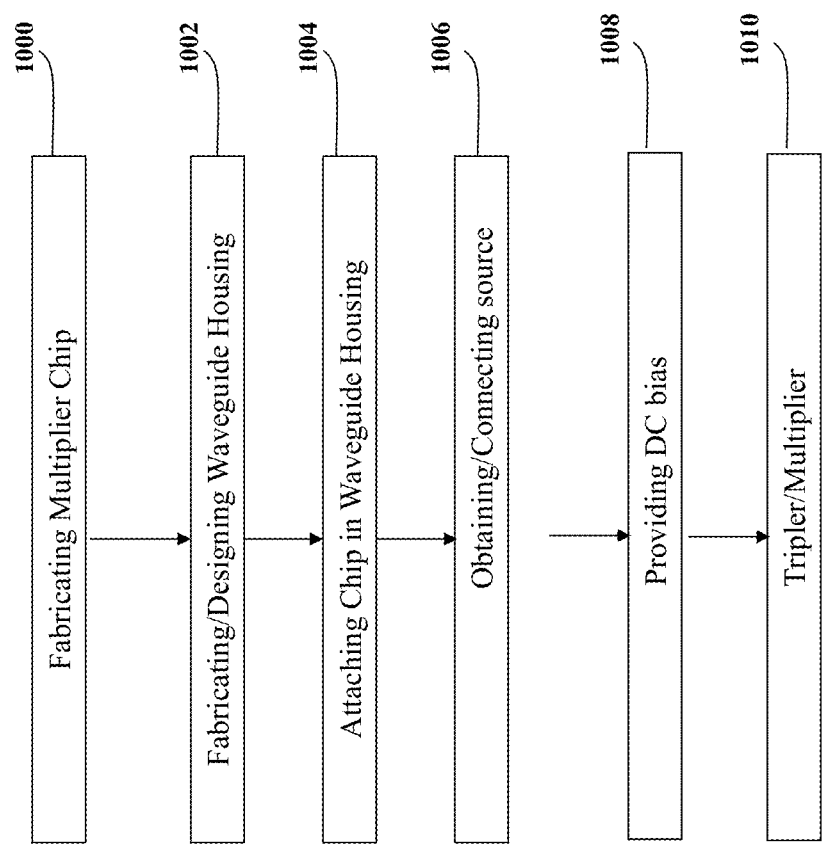
FIG. 10 illustrates a method of fabricating a tripler/multiplier device, according to one or more embodiments of the invention.

FIG. 10 is a flowchart illustrating a method of fabricating an on-chip power-combined frequency multiplier device (referring also to FIG. 1, FIG. 2, FIG. 3, and FIG. 4).

Block 1000 represents fabricating/obtaining an integrated circuit/multiplier chip including multiplier structures, e.g., using the method described in FIG. 9. The stripline antennas, the transmission lines, and the semiconductor devices (Schottky diodes) can be lithographically patterned on a semi-insulating semiconductor substrate. Each multiplying structure 204 integrated on the single chip 206 can be electrically identical.

For example, the fabricating can comprise fabricating an integrated circuit on a chip 206 comprising two or more multiplying structures 204, wherein each of the multiplying structures 204 include an input E-probe or antenna 200, 202 structured for receiving an input signal (e.g., having a frequency in a Ka-band frequency range or having a submillimeter wavelength) inputted on the chip 206 from an input waveguide/transmission line 102. Each multiplier structure further comprises two or more Schottky diodes 210 and one or more stripline based input matching networks 208a structured to transmit/optimize transmission of the input signal from the input E-probe 200 to the two or more Schottky diodes 210 (e.g., thereby forming a transmitted input signal received on each of the Schottky diodes 210). The stripline based input matching network 208a can electrically connect the input antenna 200 to two or more Schottky diodes 210 in a balanced configuration.

The two or more Schottky diodes 210 (e.g., operated as nonlinear semiconductor devices) are structured to generate output power having an output signal (e.g., two and/or three times the frequency of the input signal) using the non-linear properties of the Schottky diodes (e.g., diodes 210 are structured to each generate an output comprising a nonlinear response to the transmitted input signal received on each of the Schottky diodes 210 from the input matching network 208a). The Schottky diodes 210 can generate a third harmonic (or other harmonic) of the input signal to produce the multiplied/tripled output signal having an output frequency in the W-band or F-band or other frequency in the sub-millimeter wave regime.

Each multiplier structure 204 can further comprise one or more stripline based output matching networks 208b, 208c structured for transmitting the output (output signal/power) from each of the Schottky diodes 210 to an output E-probe or antenna 214 (also included in the multiplier structure 204). The output E-probe 214 can be structured for transmitting a multiplier output (the multiplier output comprising at least a portion of each W-band/F-band/submillimeter wave output from each of the Schottky diodes 210 or a sum of the output power generated in each of the Schottky diodes 210) off the single chip 206 into one of the output waveguides/transmission lines 108.

A total thickness of the chip 206 including metal DC bias lines and the substrate for the chip can be in a range of 3 micrometers-100 micrometers. The integrated circuit 204 on the chip 206 can include 3 pairs of the Schottky diodes (6 balanced Schottky diodes) per multiplying structure 204, for example.

The step can comprise a design phase, comprising, for a desired input power, efficiency, input frequency in a Ka-band or other frequency band, and output frequency in a W-band or F-band or in a sub-millimeter wave regime, selecting a number of the Schottky diodes 210, a size of each of the Schottky diodes 210, and a layer structure of each of the Schottky diodes that guarantee maximum power handling capabilities and conversion efficiency 210; designing stripline matching elements comprising the stripline based input matching networks 208a and the stripline based output matching networks 208b, 208c within the chip; designing the input and output E-probes 200, 214; and designing input and output waveguide matching networks for the input and output waveguides 102, 108, 110, 112, 114. The design includes selecting a structure (e.g., dimensions and material, e.g., metal such as gold) for the probes 200, 202, 214, 216, diodes 210, and striplines 208a, 208b, 208c, in order to receive or transmit the desired frequencies and power.

Block 1002 represents fabricating or obtaining a waveguide housing/block 300 including the input waveguide 102 and one or more output waveguides 108. The input waveguide 102 can include one or more waveguide matching sections 104 of different length and height to optimally couple the (e.g., Ka-band) input signal into the input E-probes 200 within the chip 206. The output waveguides 108, 110, 112, 114 can comprise one or more lengths and heights to optimally couple the tripled/multiplied output signal, comprising an electric field having a frequency in the W band or F-band of frequencies or having a sub-millimeter wavelength, out of the chip 206 and out of the device through opening.

The output waveguides can comprise two independent waveguide outputs 108, 110 combined in a Y-junction combiner 112.

The waveguide block can consist essentially of any metal, gold plated or not, that ensures a good electrical conductivity at the frequency of operation (e.g., aluminum, copper or gold-plated brass). In one or more embodiments where the housing/waveguide blocks can be fabricated in aluminum without the need for gold-plating, this enables a cost that is 3 or 4 times lower than those of traditional submillimeter-wave split-waveguide blocks.

The input and output waveguides 102, 108, 110, 112, 114 can be milled, machined, or etched into a metal block (e.g., using Computer Numerical Control (CNC) milling techniques).

The input 102 and output waveguides 108-110 can each comprise (e.g., rectangular) waveguides (e.g. having rectangular cross-sections) having metal walls. The waveguides can comprise hollow metal pipes or channels comprising ambient atmosphere (e.g., air) or a vacuum. For example, the input waveguide 102 can comprise a WR-22 waveguide (e.g., having aluminum walls and a rectangular cross-section with dimensions 5.6896 millimeters by 2.8448 millimeters optimized as a transmission line for a signal/wave having a frequency of 33-50 GHz). For example, the output waveguides 108, 110 can each comprise a WR-8 waveguide (e.g., having aluminum walls and a rectangular cross-section with dimensions 2.032 millimeters by 1.016 millimeters optimized as a transmission line for a signal/wave having a frequency of 90-140 GHz). The actual waveguide dimensions of each design depends on the specific frequencies of operation and it is not limited to WR22 and WR8 waveguides Block 1004 represents positioning/depositing/attaching/installing/fastening the chip 206 in the mechanical block or waveguide block 300 and assembling (e.g., the two halves 100 of) the waveguide block 300 with screws 302. The chip 206 can be positioned such that input probe 200 overlaps with or is inside/within the input waveguide 102, the waveguide 102 feeds the input probe 200 with the (e.g., Ka-band) signal, and output probe 214 and output probe 216 overlap and feed waveguides 108, 110, respectively.

The assembly can be such that a top surface of the chip 206, or chip plane, is either parallel or perpendicular to a (e.g., rectangular) cross-section/longitudinal axis of the input waveguide 102 and perpendicular to a (e.g., rectangular) cross-section/longitudinal axis of the output waveguides 108 (e.g., perpendicular to an E-plane of the waveguides or perpendicular to a propagation direction of the waves along the waveguides). The first output E-probe 214 (transmitting the first multiplier 204 output) and the second output E-probe 216 (transmitting the second multiplier output) extend/protrude from opposite sides of the chip 206 to within a first waveguide 108 and a second waveguide 110 (waveguide backshorts), on opposite sides of the chip 206, such that the first 108 and second waveguides 110 receive the first multiplier output and the second multiplier output, respectively.

Block 1006 represents obtaining and connecting a source. To drive the frequency triplers, one or more embodiments of the invention employ a source including a frequency synthesizer followed by an amplifier (e.g., commercially available Ka-band amplifier) operating in the 23-47 GHz band and/or an isolator. The connection between the high-power amplifier and the multiplier can be via a coaxial cable (e.g., a coax to waveguide transition can be used to transmit the input signal from the amplifier to the input waveguide 102). The Ka-band is only a specific case, the input frequency will depend on the specific case, and will not be necessarily be a Ka-band amplifier.

Block 1008 represents providing a DC bias and ground to the chip for connections 116 and 224.

Block 1010 represents the end result, a multiplier (e.g., tripler) device comprising a waveguide block 300, a multiplier chip 206 attached in the waveguide block 300, a bias source, and a source (e.g., Ka-band source).

One or more embodiments of the invention have applied the solution(s) discussed above to the design, fabrication, and testing of ultra-high power frequency triplers outputting in the following frequency bands: 85-100 GHz, 90-110 GHz and 105-120 GHz. For each band, one or more embodiments of the invention disclose a medium-power design with a 20-25% efficiency and maximum input power of around 500 mW, and a high-power version based on the novel on-chip power combined topology that exhibits a 20-25% efficiency for a maximum input power of 1 Watt (the efficiency of the device is defined as 100×output power/input power). The measured bandwidth of all the designs is around 17%. The medium power versions do not use the new topology.

The inventors have measured a 85-102 GHz, 95-112 GHz, or 105-120 GHz high-power tripler without power combining as having a maximum input power $P_{in}$=450 mW and an output power ($P_{out}$)~120 mW.

On the other hand, a 85-102 GHz, 95-112 GHz, or 105-120 GHz on-chip power combined high-power tripler, according to one or more embodiments of the invention, may have nominal $P_{in}$=900 mW and $P_{out}$~200 mW. For example, the electric field outputted from the output (and generated by the diodes 210 in response to the input signal inputted into waveguide 102) can have an output frequency in a range of 75-110 GHz, 85-120 GHz, or 105-120 GHz and have a combined output power of (e.g., at least) 190 milliwatts (e.g., at the output frequency of 116 GHz and/or for an input power of at least 800 mW). The input E probes 200, 202 can (e.g., equally) divide the input power, of the Ka-band signal guided by the input waveguide 102, among the multiplier structures 204.

With regard to efficiency, the combined output power (e.g., at the output frequency of more than 100 GHz, e.g., 116 GHz) outputted from waveguide 114 can be at least 20% or at least 30% of the input power inputted into the input waveguide 102 from the Ka-band amplifier. For example, the output power of 190 mW at 116 GHz and the efficiency of at least 20% or at least 30% can be achieved while supplying the multiplier chip 204 with DC power of no more than 200 mW through DC connections 116. For example, the unique chip designs according to one or more embodiments of the invention can produce up to 200 mW of power at a frequency up to 120 GHz with efficiencies of around 30%.

One or more embodiments of the invention can provide a source that completely avoids the use of F-band power amplifiers. Instead, one or more embodiments of the invention can use a low frequency amplifier (which can be very cheap) followed by a Schottky diode frequency tripler designed for high-power (e.g., ~1 Watt input power).

In one or more embodiments, the multiplier device is a local oscillator (LO) source for an array of heterodyne receivers (e.g., wherein the LO source does not need to include a W-band or F-band amplifier). The connection between the input source and the rest of the multiplied LO source can be via coaxial cables, which provide a very good thermal break to the LO chain. This can considerably simplify the thermal management of terahertz LO sources (e.g., as used in astrophysics and planetary science NASA missions).

One or more embodiments of the on-chip power-combining technique can be used as a high-efficiency, high-power-handling frequency multiplier to output any frequency in the submillimeter-wave regime (including, but not limited to, terahertz frequencies and frequencies above 200 GHz). Alternatively, higher frequency output, e.g., beyond 200 GHz or in a terahertz range, can be obtained by further frequency multiplying the F-band output described above in a multiplier chain.

Thus, the multiplier device can be used directly as a transmitter when connected to an external output antenna (e.g. horn antenna), as the local oscillator for an array of heterodyne receivers connected to the local oscillator, or as a driver stage for higher frequency sources.

Applications

One or more embodiments of the invention can be used as a source in one or more of the following applications All-solid-state single-pixel high-resolution heterodyne receivers at submillimeter wavelengths have played a major role in astrophysics as well as in earth and planetary remote sensing. Missions such as ESA's Herschel Space Observatory (with NASA contribution) and NASA's Microwave Limb Sounder have further increased the scientific community's interest in submillimeter-wave spectroscopy. New requirements are now demanded by scientists for future NASA missions involving submillimeter-wave heterodyne instruments.

For astrophysics, multi-pixel sources are required in order to reduce integration time and to enable efficient mapping of galaxies, star-forming regions, interstellar clouds, etc (current heterodyne terahertz instruments are single pixel). Due to the successful results obtained with the HIFI instrument onboard Herschel, astronomers are now looking into the heterodyne observation of the interstellar neutral oxygen (at 63 micrometers (um)), which has never been observed with high resolution. This interstellar neutral oxygen (OI) line is one of the major coolants of molecular clouds and its observation will help to understand the star-forming cycle and the processes that lead to planetary systems formation.

All-solid state room-temperature multi-pixel submillimeter-wave receivers are also in high demand for efficient spatial mapping/remote sensing of a planet's atmosphere composition and wind velocities (e.g., for future NASA missions to Venus, Jupiter and its moons (e.g., Europa), etc). In the past few years NASA has turned its attention to an Outer Planet Flagship Mission (OPFM) to the Jupiter system (focusing on Ganymede, Europa and other Galilean moons, as well as Jupiter) and to the Saturn system. Room temperature operation based on Schottky diode technology is a must in order to avoid cryogenic cooling and enable long-term missions.

Mission concept studies for these missions call for inclusion of a terahertz instrument to perform a new category of measurement. The 1.9-2.1 THz band is particularly important for multi-pixel receivers. Terahertz spectrometers will complement microwave and infrared (IR) instruments; it is the only technology capable of resolving winds, temperature, pressure and composition in this critical layer of the atmosphere, and will fill the gap left by the other measurement technologies. A long lifetime mission is possible with compact all-solid state Schottky diode based receivers since they can operate without the need of any active cryocooling system. For astrophysics, next generation instruments for space telescopes (Herschel follow-on missions, Millimetron, etc.) or airborne telescopes (SOFIA) will directly benefit from one or more proposed techniques described herein and incorporate ultra-compact multi-pixel terahertz receivers.

High resolution ultra-compact multi-pixel radar-transceivers operating at submillimeter waves can be used in orbit for sub-cm space debris detection.

One or more embodiments of the present invention's technology are also being successfully applied to the implementation of very high-resolution imaging radars for stand-off detection of concealed weapons. For submillimeter-wave radar imaging, the main issue is that, in order to reach video frame rates with high image pixel density, multi-pixel focal plane transceiver arrays are needed to illuminate targets with many radar beams simultaneously. One or more embodiments of the present invention can be used as a source to illuminate targets with several radar beams simultaneously.

In addition, achieving very high power in the 230 GHz band (which can be achieved using multipliers according to one or more embodiments of the invention) is a very important for high-resolution radar imaging and submillimeter-wave communications for military applications.

Advantages and Improvements

The main issue (for achieving the above described goals and applications) is to improve/increase the limited power handling capabilities of state-of-the-art GaAs Schottky diode technology used for the local oscillators (LO) in these heterodyne receivers. The limited power handling capabilities of the Schottky diode technology makes it extremely difficult to generate the amount of LO power necessary for millimeter-wave and submillimeter-wave radar imaging, to drive multi-pixel heterodyne receivers beyond 500 GHz, and to extend the operation frequency of single-pixel receivers beyond 2 THz up to 4.7 THz (63 um OI line).

In particular, no commercially available high-power sources output beyond 105 GHz and therefore commercially available sources do not provide the amount of output power per chip (>150 mW) required for all the applications mentioned above. One or more embodiments of the present invention can satisfy this need.

The inventors' group at the Jet Propulsion Laboratory (JPL) is the world leader in millimeter- and submillimeter-wave frequency multiplied LO sources based on GaAs Schottky diode technology. As disclosed herein, one or more embodiments of the present invention use a solution that incorporates a novel topology called "on-chip power-combining," that allows a factor of 2 or 4 increase in the power-handling of traditional frequency multipliers. Moreover, the epi-structure and anode size of the devices has been, for the first time, optimized to reach performance limits of the GaAs Schottky diode technology (in terms of power-handling and efficiency at Ka-band, W-band, and F-band frequencies).

Thus, using one or more of the inventors' extensive experience in Schottky diode technology, one or more of the inventors' state-of-the-art Schottky micro-fabrication process established for the development of the local oscillators for the HIFI instrument on-board the Herschel Space Observatory, the novel on-chip power combining techniques to boost up the power of traditional Schottky multipliers, and improved optimization methods based on physics-based modeling of the semiconductor devices, one or more embodiments of the invention disclose and produce ultra-high power high-performance Schottky diode based frequency triplers able to handle up to 800-1000 mW input power and produce up to 200 mW output power at W-band (70-110 GHz) and F-band (90-140 GHz) frequencies, using a single-chip. This corresponds to a conversion efficiency of 20-30% and sets a new state-of-the-art record for power generation at these (W-band and F-band) frequency bands. The frequency bandwidth of these frequency multipliers is 15-20%, which is larger than that of power amplifiers operating at W-band frequencies.

Conventional frequency multipliers outputting in the W-band or F-band, on the other hand, exhibit ~5% conversion efficiencies and maximum input power levels of around 200 mW. Thus, one or more embodiments of the invention provide a factor of 4 to 5 increase in power and efficiency, as compared to the current state-of-the-art devices.

Moreover, one or more embodiments of the high-power high-efficiency frequency multiplier design presented herein can be pumped with low-cost, high-power Ka band amplifiers, and such that all the power dissipation is in the Ka-band instead of W-band or F-band. Thus, one or more embodiments of the invention do not use (e.g., high-power) W-band or F-band amplifiers. Such W-band or F-band amplifiers are not commercially available (they are leftovers from a decade-old flight program), are narrow band, and tend to introduce noise in the LO system.

In addition, one or more embodiments of the invention provide multipliers that not only compete, but also surpass the performance of amplifier-based solutions. For example, one or more embodiments of the present invention can provide multiplier devices that are more compact, cheaper, and produce more power (from a single chip) than either GaAs-based amplifiers or GaN-based amplifiers. Indeed, devices according to one or more embodiments of the invention can operate up to 120 GHz (and can be pumped with a low cost, high power Ka-band amplifier), whereas commercially available high-power amplifiers do not operate beyond 105 GHz. Hence one or more embodiments of the present invention provide a solution that considerably reduces the cost of high-power sources.

In addition, multipliers according to one or more embodiments of the invention can be flight qualified (e.g., robust).

REFERENCES

The following references are incorporated by reference herein.

[1] H. Song and T. Nagatsuma, "Present and Future of Terahertz Communications," *IEEE Trans. on THz. Sc. And Tech.*, Vol. 1, pp. 256-263, September 2011

[2] K. Cooper, et al., "THz Imaging Radar for Standoff Personnel Screening," *IEEE Trans. on THz. Sc. And Tech.*, Vol. 1, pp. 33-53, September 2011

[3] G. Chattopadhyay, "Technology, Capabilities, and Performance of Low Power Terahertz Sources," *IEEE Trans. on THz. Sc. And Tech.*, Vol. 1, pp. 169-181, September 2011.

[4] HRL Laboratories LLC., http://mmics.hrl.com

[5] Millitech Inc., http://www.millitech.com

[6] R. Ferber, et al., "W Band MMIC Power Amplifiers for the Herschel HIFI Instrument," *Proc. of* 14*th Int. Symp. Space THz Tech.*, April 2003.

[7] V. Radisic, K. Leong, X. Mei, S. Sarkozy, W. Yoshida, P. Liu, J. Uyeda, R. Lai, W. Deal, Ä 50 mW 220 GHz Power Amplifier Module," *IEEE MTT-S Int. Microwave Symp. Dig.*, pp. 45-48, June 2010.

[8] J. V. Siles, et al., "Design of a high-power 1.6 THz Schottky tripler using 'on-chip' power-combining and Silicon micromachining," *In Proc. of* 22*th Int. Symp. on Space Terahertz Tech.*, April 2011.

[9] J. V. Siles, "On-Chip Power-Combining for High-Power Schottky Diode Based Frequency Multipliers," U.S. Patent 20130229210, Sep. 5, 2013.

[10] B. Thomas, et al., "W-band Balanced Frequency Tripler Using a Novel Coupled Lines Biasing Scheme Compatible with Flip-Chip Mounting," *In Proc. of* 23*th Int. Symp. on Space Terahertz Tech.*, April 2012.

[11] Virginia Diodes, Inc., "High-Efficiency 94 GHz Frequency Tripler Development at VDI," *Company newsletters*, February 2008. Available online at http://vadiodes.com/VDI/pdf

[12] J. Vukusic, T. Bryllert, A. Olsen, and J. Stake, "High Power W-band Monolithically Integrated Tripler," *In Proc. of* 34*th Int. Conf on Infrared, Millimeter and THz Waves.*, September 2009.

[13] A. Maestrini, et al., "In-phase power-combined frequency triplers at 300 GHz," *IEEE Microw. Wireless Compon. Lett.*, vol. 18, pp. 218-220, March 2008.

[14] A. Maestrini, J. Ward, J. Gill, H. Javadi, E. Schlecht, C. Tripon-Canseliet, G. Chattopadhyay and I. Mehdi, "A 540-640 GHz High Efficiency Four Anode Frequency Tripler," *IEEE Trans. Microwave Theory Tech*, Vol. 53, pp. 2835-284, September 2005.

[15] "A High-Power 105-120 GHz Broadband On-Chip Power-Combined Frequency Tripler," by Jose V. Siles, Choonsup Lee, Robert Lin, Goutam Chattopadhyay, Theodore Reck, Cecile Jung-Kubiak, Imran Mehdi, and Ken B. Cooper, Microwave and Wireless Components Letters, IEEE (Volume: 25, Issue: 3).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A Schottky diode based all-solid-state frequency multiplier, comprising:
   a substrate; and
   a single chip mounted on the substrate, the single chip configured for outputting an output power of at least 100 milliwatts (mW) at a frequency of at least 70 GHz in response to input power having an input frequency, including components for handling the input power of at least 200 mW and a plurality of on-chip power combined multiplying structures, each multiplying structure comprising:
      an input antenna or input E-probe,
      a plurality of Schottky diodes,
      an output antenna or output E-probe,
      a first impedance matching structure connected to the Schottky diodes and the output antenna or the output E-probe, and
      a second impedance matching structure connected to the Schottky diodes and the input antenna or the input E-probe, and
   wherein:
   the input power received from a transmission line is distributed to each of the multiplying structures using the input antennas or the input E-probes located on the chip, each of the input antennas or the input E-probes connected to a different one of the multiplying structures, and
   the Schottky diodes each have their anode size and epi-structure configured to generate a higher frequency output through frequency-multiplication of the input frequency so that each of the higher frequency outputs can be combined to form the output power of at least 100 mW using the multiple output E-probes or output antennas of the different multiplying structures.

2. The multiplier of claim 1, wherein:
   the multiplier further comprises a waveguide combining structure connected to the output E-probes or output antennas, and
   the epi-structure and the chip's geometry are optimized, such that the output power is higher than 100 milliwatts.

3. The multiplier of claim 1, wherein the epi-structure comprising a GaAs heterostructure and the chip's geometry are such that each of the diodes can handle 80 milliwatts of the input power.

4. The multiplier of claim 3, wherein the output power has a frequency in an F-band and/or W-band.

5. A multiplier device, comprising:
   a waveguide block comprising an input waveguide, wherein the input waveguide guides an input signal having a frequency and an input power; and
   a chip connected to the input waveguide, the chip comprising two or more multiplying structures, wherein:
      each of the multiplying structures include:
         an input E-probe structured for receiving the input signal from the input waveguide,
         two or more Schottky diodes,
         one or more stripline based input matching networks structured to transmit the input signal from the input E-probe to the two or more Schottky diodes, to generate output power comprising an output signal having two or three times the frequency of the input signal using the nonlinear properties of the Schottky diodes,
         one or more stripline based output matching networks structured for transmitting the output signal from each of the Schottky diodes to an output E-probe,
         the output E-probe structured for transmitting a multiplier output, comprising a sum of the output powers generated in each of the Schottky diodes, off the single chip and into an output waveguide, and so that a combination of the output powers is a combined output power of at least 100 milliwatts (mW) at a frequency of at least 70 GHz in response to the input signal having the input power of at least 200 milliwatts.

6. The device of claim 5, wherein the waveguide block comprises metal.

7. The device of claim 5, wherein:
   each of the multiplying structures include metal direct current (DC) bias lines for biasing the Schottky diodes to optimize the device performance, and
   a total thickness of the chip including the metal DC bias lines and a substrate for the chip is in a range of 3 micrometers-100 micrometers.

8. The device of claim 5, wherein:
   each of the multiplying structures include metal direct current (DC) bias lines for biasing the Schottky diodes to optimize the device performance, and
   a total thickness of the chip including the metal DC bias lines and the substrate for the chip is at least 3 micrometers.

9. The device of claim 5, wherein the input signal is received from a source outputting the frequency of at least 23 Gigahertz (GHz).

10. The device of claim 9, wherein the output signal has an output frequency in a W-band and/or F band of frequencies.

11. The device of claim 5, wherein:
    the input E-probes include more than one input E-probe within the input waveguide,
    a top surface of the chip is perpendicular or parallel to a longitudinal axis of the input waveguide and perpendicular to the longitudinal axes of the output waveguides,
    and half of the output E-probes extend from opposite sides of the chip with regards to the other half of the output E-probes.

12. The device of claim 11, further comprising:
output waveguides including a first waveguide and a second waveguide on the opposite sides of the chip to receive the multiplier outputs, and
a waveguide combiner combining the first waveguide and the second waveguide.

13. A method of fabricating a solid-state device, comprising:
micro-fabricating a chip including diodes, on-chip power combining, and on-chip power distribution, wherein:
the on-chip power distribution distributes an input power, transmitted onto the chip and having an input frequency, among the diodes,
the diodes each comprise an anode and a Schottky diode heterostructure,
the diodes each generate a higher frequency output through frequency multiplication of the input frequency,
each of the higher frequency outputs are combined to form a combined output power using the on-chip power combining,
the anodes are micro-fabricated simultaneously on a same patch of a semiconductor wafer and under identical conditions, and
the anodes are balanced in terms of electrical behavior; and
such that the device when biased generates the combined output power of at least 100 milliwatts (mW) at a frequency of at least 70 GHz in response to input power having an input power of at least 200 milliwatts.

14. The method of claim 13, further comprising selecting the Schottky diode heterostructure and the chip's geometry such that the chip outputs the combined output power generated by each multiplying structure operating at a frequency in an F-band and/or W-band of frequencies.

15. The method of claim 13, comprising:
fabricating the chip comprising two or more multiplying structures, wherein:
each of the multiplying structures include:
the on-chip distribution including an input E-probe structured for receiving an input signal, having the input frequency, from an input waveguide,
the diodes comprising two or more Schottky diodes,
the on-chip distribution including one or more stripline-based input matching networks structured to transmit the input signal, from the input E-probe to the two or more Schottky diodes, to generate output power having an output signal two or three times the input frequency of the input signal using nonlinear properties of the Schottky diodes,
the on-chip power combining including one or more stripline-based output matching networks structured for transmitting the output signal from each of the Schottky diodes to an output E-probe, and
the output E-probe structured for transmitting a multiplier output, comprising a sum of the output powers of the output signal generated in each of the Schottky diodes, off the single chip and into an output waveguide.

16. The method of claim 15, further comprising:
fabricating and/or obtaining a waveguide block, comprising an input waveguide and output waveguides, wherein, when the waveguide block is connected to the chip:
the input waveguide guides the input power, received from a source, to the input E-probes, and
the output waveguides combine the multiplier outputs from each of the multiplying structures to produce a combined output.

17. The method of claim 16, further comprising milling the input waveguide and the output waveguides into a metal block.

18. The method of claim 16, wherein the source includes a frequency synthesizer followed by an amplifier and/or additional frequency multiplier outputting the frequency in a range of at least 23 GHz—and/or an isolator, the method further comprising connecting the amplifier and/or the additional frequency multiplier and/or the isolator to the waveguide block and attaching the chip inside the waveguide block.

* * * * *